United States Patent
Deng et al.

(10) Patent No.: US 10,403,546 B2
(45) Date of Patent: Sep. 3, 2019

(54) METHOD TO FORM HYBRID SIGE FIN

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Hao Deng, Shanghai (CN); Jianhua Xu, Shanghai (CN); Feng Zhou, Shanghai (CN); Xiaojun Yang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/925,326

(22) Filed: Mar. 19, 2018

(65) Prior Publication Data
US 2018/0277439 A1 Sep. 27, 2018

(30) Foreign Application Priority Data
Mar. 21, 2017 (CN) .......................... 2017 1 0167448

(51) Int. Cl.
*H01L 27/088* (2006.01)
*H01L 21/8234* (2006.01)

(52) U.S. Cl.
CPC ............... *H01L 21/823431* (2013.01); *H01L 21/823412* (2013.01); *H01L 27/0886* (2013.01)

(58) Field of Classification Search
CPC combination set(s) only.
See application file for complete search history.

(56) References Cited

U.S. PATENT DOCUMENTS

| 9,488,765 B2 * | 11/2016 | Kang | .................. G02B 5/3058 |
| 2016/0274285 A1 * | 9/2016 | Kang | .................. G02B 5/3058 |
| 2016/0315014 A1 * | 10/2016 | Chou | ............... H01L 21/82348 |

* cited by examiner

*Primary Examiner* — Telly D Green
(74) *Attorney, Agent, or Firm* — Kilpatrick Townsend & Stockton LLP (57) ABSTRACT

A method for manufacturing a semiconductor device includes providing a semiconductor structure having a semiconductor substrate, a dielectric layer on the semiconductor substrate, and a hardmask on a second portion of the dielectric layer while exposing a first portion of the dielectric layer; forming a copolymer on the semiconductor structure; performing an annealing treatment such that the copolymer forms a staggered configuration of a first monomer and a second monomer; removing the first monomer; performing a first etching process on the first portion using the second monomer as a mask to form a first trench extending to the semiconductor substrate; removing the second monomer and the first hardmask; and epitaxially growing a first semiconductor fin in the first trench.

16 Claims, 8 Drawing Sheets

METHOD TO FORM HYBRID SIGE FIN

CROSS-REFERENCES TO RELATED APPLICATIONS

The present application claims priority to Chinese patent application No. 201710167448.6, filed with the State Intellectual Property Office of People's Republic of China on Mar. 21, 2017, the content of which is incorporated herein by reference in its entirety.

FIELD OF THE DISCLOSURE

The present disclosure relates to the field of semiconductor technology, and more particularly to a semiconductor device having a hybrid SiGe fin and method for manufacturing the same.

BACKGROUND OF THE INVENTION

Germanium is a known semiconductor material that has electron mobility and hole mobility higher than those of silicon. Therefore, the use of germanium in the fabrication of integrated circuits will improve the performance of the integrated circuits.

As the feature size of semiconductor devices decreases, the short-channel effect becomes more pronounced. In order to mitigate the short-channel effect, fin field effect transistors (FinFETs) are used instead of planar transistors.

However, as finFET devices further scale, the FinFET devices may face many problems, in particular, short-channel effects may degrade the ability of the gate to control the on and off the FinFET devices.

BRIEF SUMMARY OF THE INVENTION

Embodiments of the present invention provide a method for manufacturing a semiconductor device. The method may include providing a semiconductor structure including a semiconductor substrate, a dielectric layer on the semiconductor substrate, and a hardmask on a second portion of the dielectric layer while exposing a first portion of the dielectric layer; forming a copolymer on the semiconductor structure; performing an annealing treatment such that the copolymer forms a staggered configuration of a first monomer and a second monomer; removing the first monomer; performing a first etching process on the first portion using the second monomer as a mask to form a first trench extending to the semiconductor substrate; removing the second monomer and the first hardmask; and epitaxially growing a first semiconductor fin in the first trench.

In one embodiment, the method may further include forming a second trench in the second portion extending to the semiconductor substrate; and epitaxially growing a second semiconductor fin in the second trench.

In one embodiment, the first semiconductor fin and the second semiconductor fin each include silicon germanium (SiGe). In one embodiment, each of the first semiconductor fin and the second semiconductor fin includes a Ge content that gradually changes from bottom to top.

In one embodiment, the Ge content of the first semiconductor fin gradually increases from bottom to top, and the Ge content of the second semiconductor fin gradually decreases from bottom to top.

In one embodiment, the Ge content of the first semiconductor fin gradually decreases from bottom to top, and the Ge content of the second semiconductor fin gradually increases from bottom to top.

In one embodiment, forming the second trench in the second portion of the dielectric layer includes forming a second hardmask on the first portion of the dielectric layer; forming a second copolymer on the second hardmask and the second portion; performing a second annealing treatment such that the second copolymer forms a staggered configuration of a third monomer and a fourth monomer; removing the third monomer; performing a second etching process on the second portion using the fourth monomer as a mask to form the second trench extending to the semiconductor substrate; and removing the forth monomer and the second hardmask.

In one embodiment, the first copolymer and the second copolymer include a same material; the first monomer and the third monomer include essentially a same material and same dimensions; and the second monomer and the fourth monomer include essentially a same material and the same dimensions.

In one embodiment, the method further includes etching back the dielectric layer such that an upper surface of the etched back dielectric layer is lower than an upper surface of the first semiconductor fin and the second semiconductor fin.

In one embodiment, the first copolymer comprises polystyrene-block-polymethylmethacrylate (PS-b-PMMA). In one embodiment, the first monomer includes polymethylmethacrylate and the second monomer includes polystyrene.

In one embodiment, the first monomer has a width greater than a width of the second monomer. In one embodiment, the width of the first monomer is about 20 nm, and the width of the second monomer is about 15 nm.

In one embodiment, forming the copolymer includes a spin coating process.

In one embodiment, removing the first monomer includes performing an ultraviolet (UV) curing treatment on the first monomer and removing the first monomer by washing with acetic acid ($CH_3COOH$).

In one embodiment, removing the second includes a reactive ion etching process.

In one embodiment, annealing treatment is performed at a temperature in a range between 80° C. and 150° C.

Embodiments of the present invention also provide a semiconductor device. The semiconductor device includes a semiconductor substrate; a first SiGe semiconductor fin on the semiconductor substrate, the first SiGe semiconductor fin having a Ge content that gradually changes from bottom to top; and a dielectric layer on the semiconductor substrate and side surfaces of the first SiGe semiconductor fin, the dielectric layer having an upper surface lower than upper surface of the first SiGe semiconductor fin.

In one embodiment, the semiconductor device further includes a second SiGe semiconductor fin on the semiconductor substrate and having an upper surface higher than the upper surface of the dielectric layer.

In one embodiment, the Ge content (Ge concentration) of the first SiGe semiconductor fin gradually increases from bottom to top, and the Ge content (Ge concentration) of the second semiconductor fin gradually decreases from bottom to top.

In one embodiment, the Ge content (Ge concentration) of the first semiconductor fin gradually decreases from bottom to top, and the Ge content (Ge concentration) of the second semiconductor fin gradually increases from bottom to top.

The following detailed description together with the accompanying drawings will provide a better understanding of the nature and advantages of the present disclosure.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It is noted that the reference numerals and letters denote similar items in the accompanying drawings. Thus, once an item is defined or illustrated in a drawing, it will not be further described in subsequent drawings.

Figure 1:
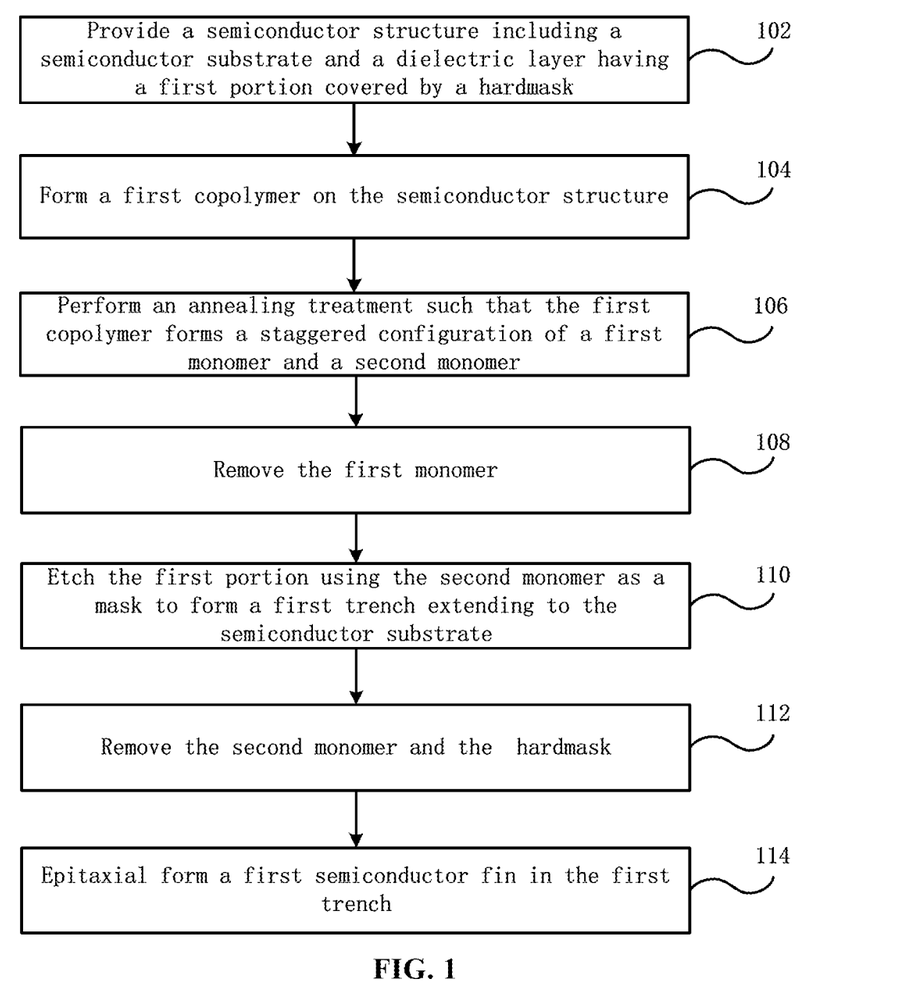
FIG. 1 is a simplified flowchart of a method for manufacturing a semiconductor device according to one embodiment of the present invention.

FIG. 1 is a flowchart of a method for manufacturing a semiconductor device according to an embodiment of the present disclosure. FIG. 2A to FIG. 2G are cross-sectional views illustrating intermediate stages in the process of forming a semiconductor device according to one embodiment of the present invention.

A method for manufacturing a semiconductor device according to an embodiment of the present invention will be described in detail with reference to FIG. 1 and FIG. 2A to FIG. 2G.

Referring to FIG. 1, at 102, the method may include providing a semiconductor structure.

Figure 2A:
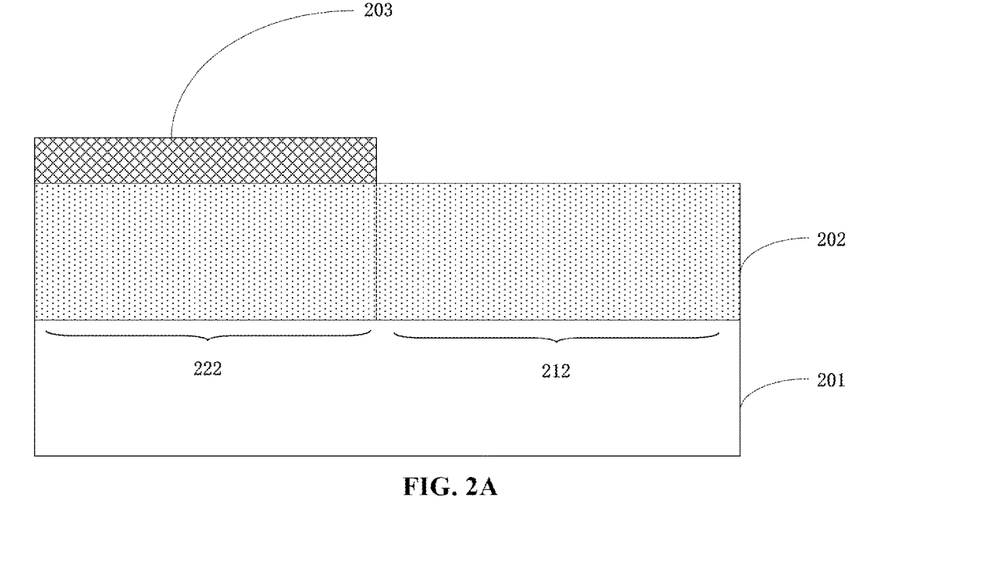
FIGS. 2A through 2G are cross-sectional views illustrating intermediate stages in the process of forming a semiconductor device according to one embodiment of the present invention.

FIG. 2A is a cross-sectional views illustrating a semiconductor structure according to one embodiment of the present invention. Referring to FIG. 2A, the semiconductor structure includes a semiconductor substrate (e.g., silicon substrate, III-V semiconductor compound substrate) 201, a dielectric layer 202 (e.g., silicon oxide layer) on semiconductor substrate 201, and a first hardmask (e.g. silicon nitride layer) 203 on dielectric layer 202. In the embodiment, a portion of dielectric layer 202 not covered by first hardmask 203 is referred to as a first portion 212.

It is noted that first portion 212 and second portion 222 are opposite from each other for distinguishing the portion of dielectric layer 202 covered by first hardmask 203 and the portion not covered by the hardmask.

In one embodiment, the semiconductor structure shown in FIG. 2A may be formed by providing a semiconductor substrate 201, forming a dielectric layer 202 on semiconductor substrate 201, forming a hardmask material layer on dielectric layer 202, and patterning the hardmask material layer to form a first hardmask 203.

Figure 2B:
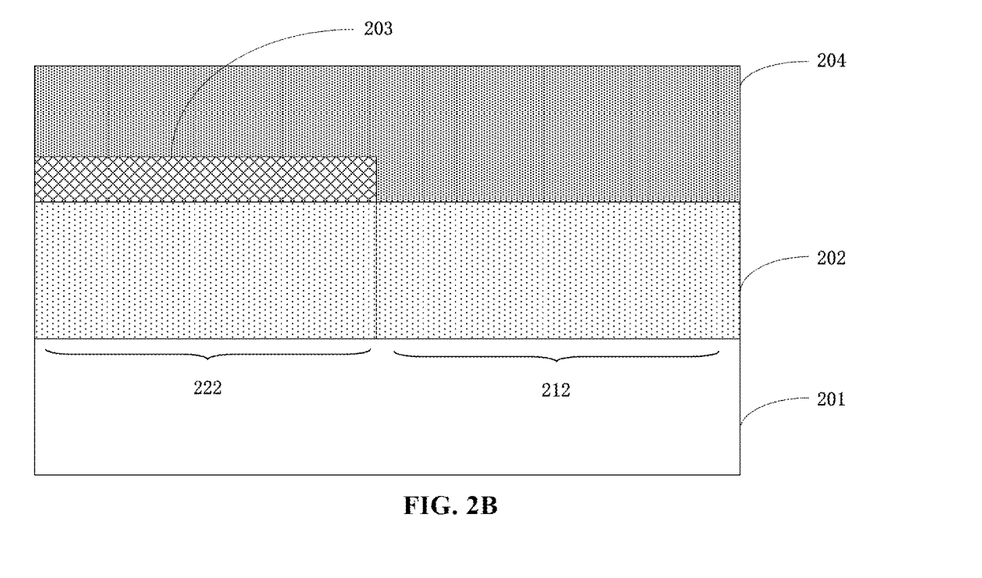

Next, at 104, a first copolymer 204 is formed on the semiconductor structure, as shown in FIG. 2B. In one embodiment, first copolymer 204 is a polystyrene-block-polymethylmethacrylate (PS-b-PMMA). For example, first copolymer 204 may be formed on the semiconductor structure by a spin coating process.

Figure 2C:
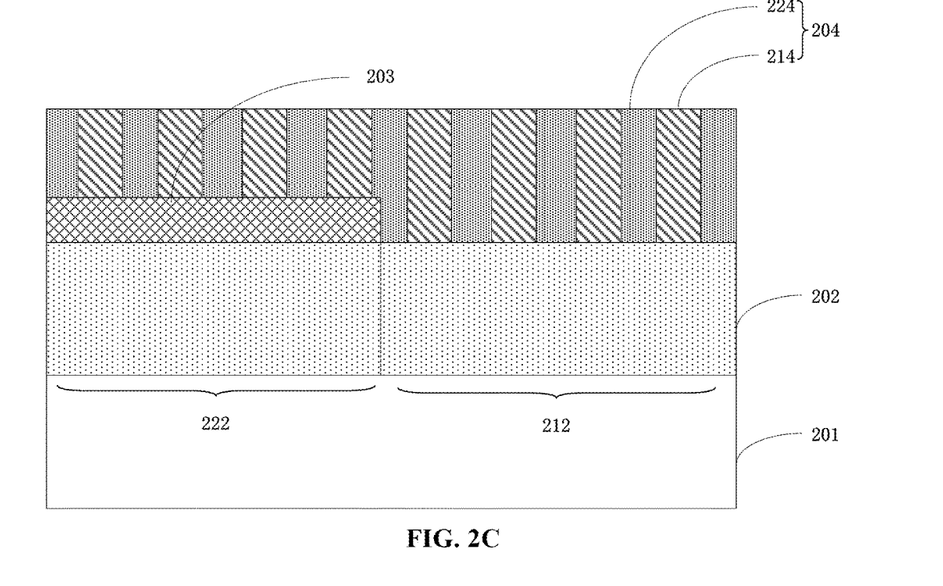

Next, at 106, an annealing treatment is performed such that first copolymer 204 forms a staggered configuration of a first monomer 214 and a second monomer 224, as shown in FIG. 2C. In one embodiment, the annealing treatment is performed at a temperature in the range between 80° C. and 150° C., e.g., 90° C., 100° C., 120° C., or 130° C.

In one embodiment, first monomer 214 may be polymethyl methacrylate, and second monomer 224 may be polystyrene. The different monomers have different monomer molecular structures, so that their width are also different. In one embodiment, first monomer 214 has a cross-sectional width greater than a cross-sectional width of the second monomer. In one embodiment, first monomer 214 has a width of about 20 nm, and second monomer 224 has a width of about 15 nm.

Figure 2D:
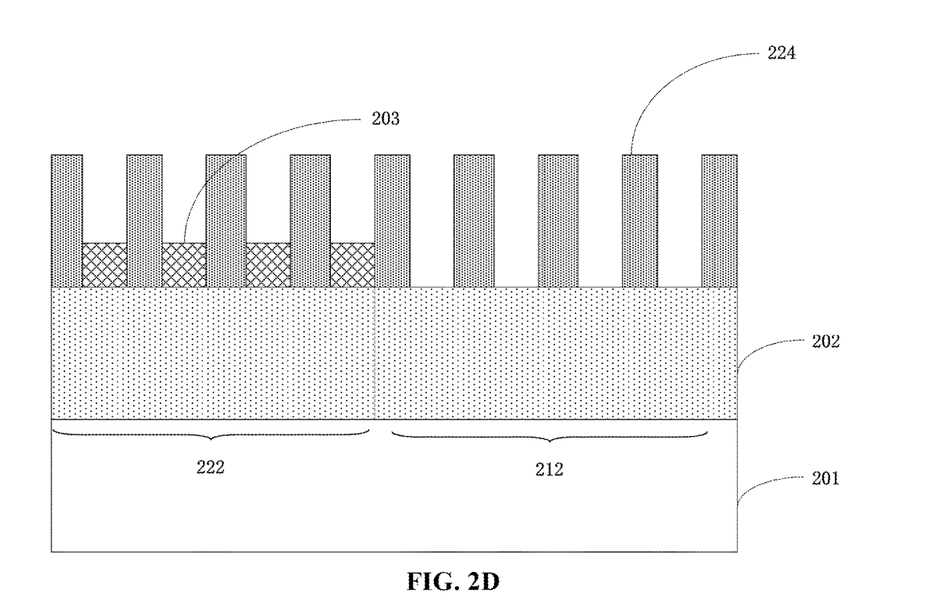

Next, at 108, first monomer 214 is removed, as shown in FIG. 2D. In one embodiment, first monomer 214 may be subjected to a UV curing treatment, first monomer 214 after the UV curing treatment may be washed with an acetic acid $CH_3COOH$ to remove first monomer 214.

Figure 2E:
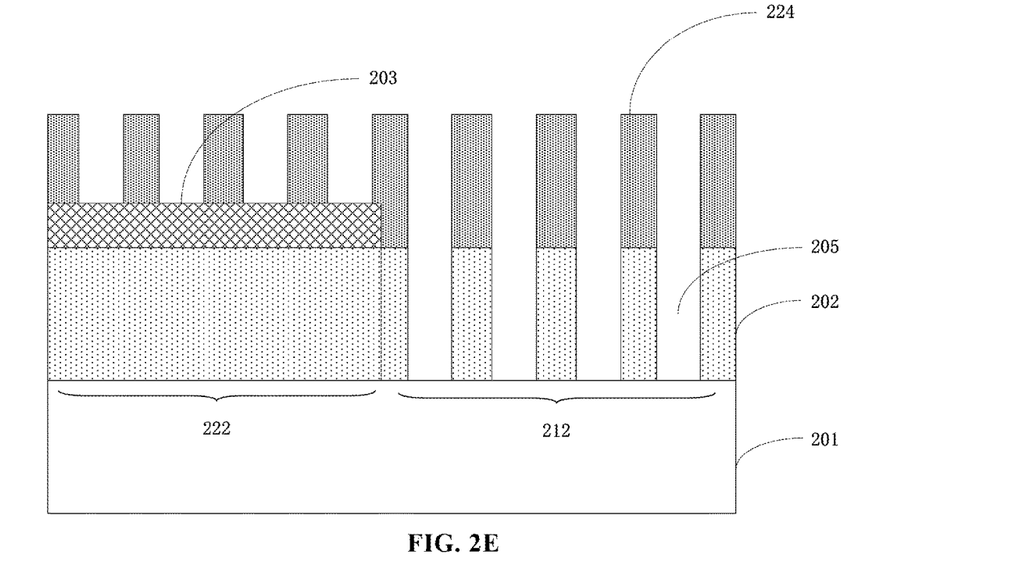

Next, at 110, an etching process is performed on first portion 212 using second monomer 224 as a mask to form a first trench 205 extending to semiconductor substrate 201, as shown in FIG. 2E. In the embodiment, since second portion 222 is covered by hardmask 203, the etching process on first portion 212 can be performed by a selective etching process.

Figure 2F:
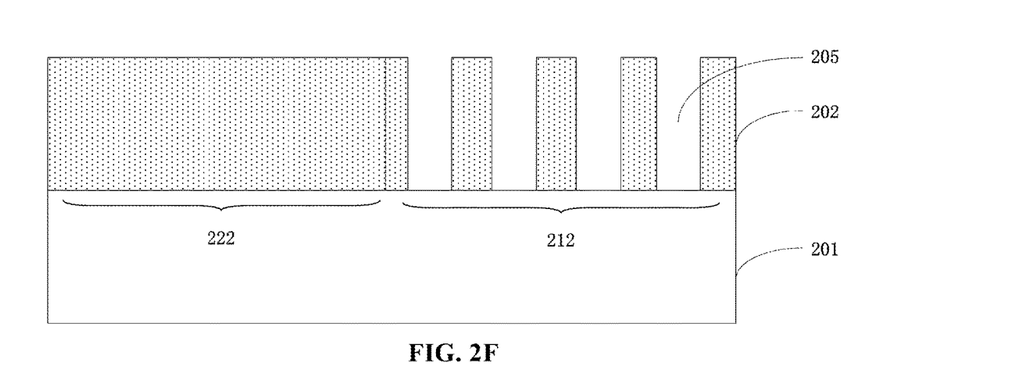

Next, at 112, second monomer 224 and first hardmask 203 are removed, as shown in FIG. 2F. In one embodiment, second monomer 224 may be removed using a reactive ion etching (ME) process. In one embodiment, first hardmask 203 may be removed using a planarization process, such as a chemical mechanical polishing (CMP) process.

Figure 2G:
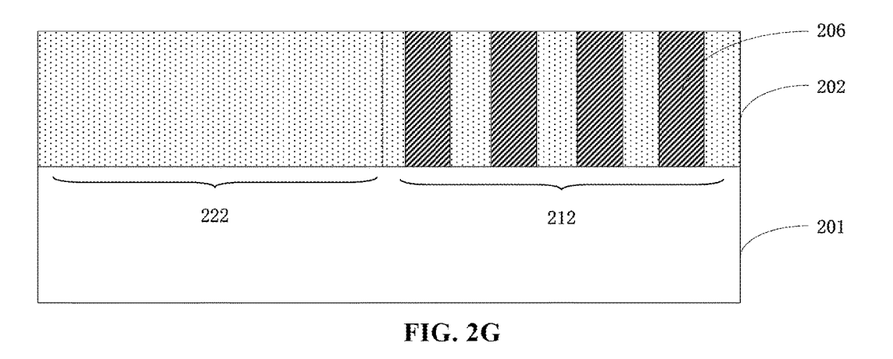

Next, at 114, a first semiconductor fin 206 is epitaxially grown in first trench 205, as shown in FIG. 2G. In one embodiment, first semiconductor fin 206 include SiGe. In one embodiment, the ratio of Ge/Si in a precursor is gradually adjusted during the process of epitaxially growing first semiconductor fin 206 from bottom to top, so that the content of Ge (Ge concentration) gradually changes from bottom to top. In one example embodiment, the content of Ge (the proportion of germanium atoms) in first semiconductor fin 206 gradually increases from bottom to top. In another example embodiment, the content of Ge (the proportion of germanium atoms) in first semiconductor fin 206 gradually decreases from bottom to top.

The above-described embodiment of the present invention provides a method of manufacturing a semiconductor device. The embodiment of the present invention discloses the use of copolymers to produce semiconductor fins. In one aspect, the process is simple and can be implemented used conventional manufacturing techniques. In other aspect, different sizes of semiconductor fins can be manufactured based on different copolymers.

Other processes can be performed subsequently according to actual requirements.

In one example embodiment, dielectric layer 202 may be etched back such that the upper surface of etched back dielectric layer 202 is lower than the upper surface of first semiconductor fin 206. Thereafter, a gate structure may be formed on first semiconductor fin 206.

In another example embodiment, a second trench extending to semiconductor substrate 201 may also be formed in first portion 212. Thereafter, a second semiconductor fin is epitaxially formed in the second trench.

In one embodiment, the second trench may be formed in the same way as the first trench using the above-described process steps.

FIGS. 3A through 3H are cross-sectional views illustrating intermediate stages in the process of forming a semiconductor device according to another embodiment of the present invention.

Figure 3A:
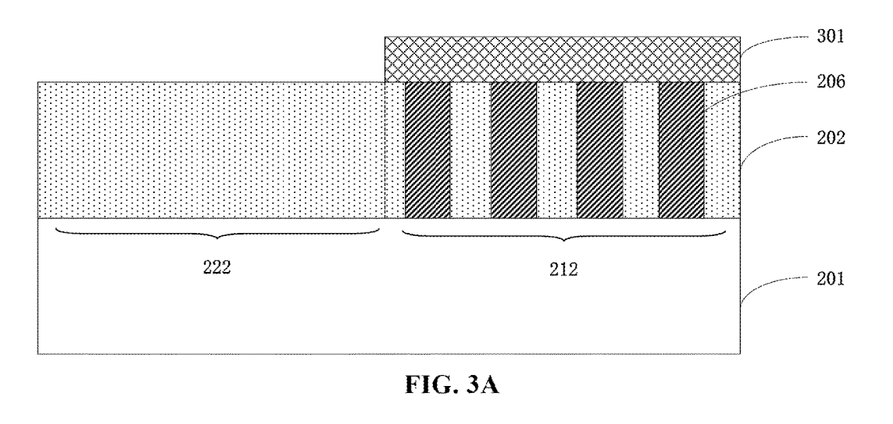
FIGS. 3A through 3H are cross-sectional views illustrating intermediate stages in the process of forming a semiconductor device according to another embodiment of the present invention.

Referring to FIG. 3A, a second hardmask 301 (e.g., silicon nitride) is formed on first portion 212 of the dielectric layer. For example, a second hardmask material layer may be formed on the structure shown in FIG. 2F. The second hardmask material layer is then patterned to expose a portion of dielectric layer 202, the patterned hardmask material layer is second hardmask 301.

Figure 3B:
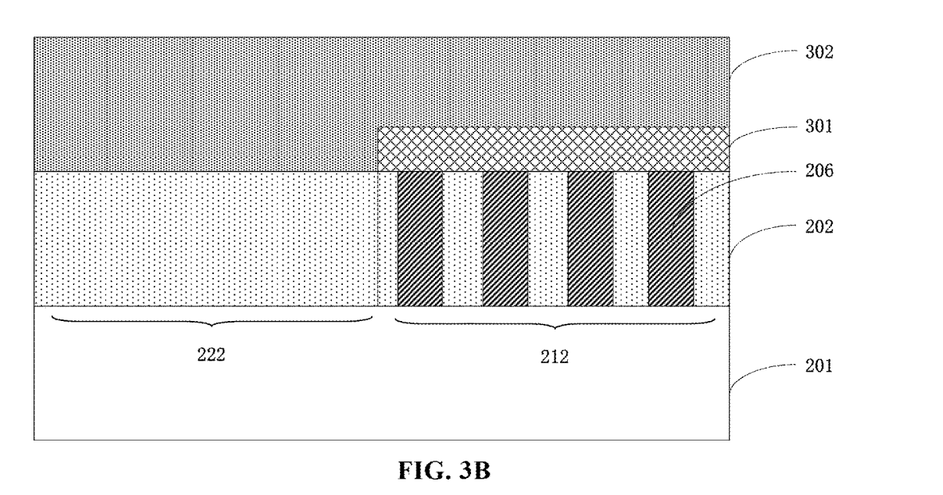

Referring to FIG. 3B, a second copolymer 302 is formed (e.g., by spin coating) on second hardmask layer 301 and second portion 222. In one embodiment, second copolymer 302 is of the same material as first copolymer 204, e.g., polystyrene-block-polymethylmethacrylate (PS-b-PMMA).

Figure 3C:
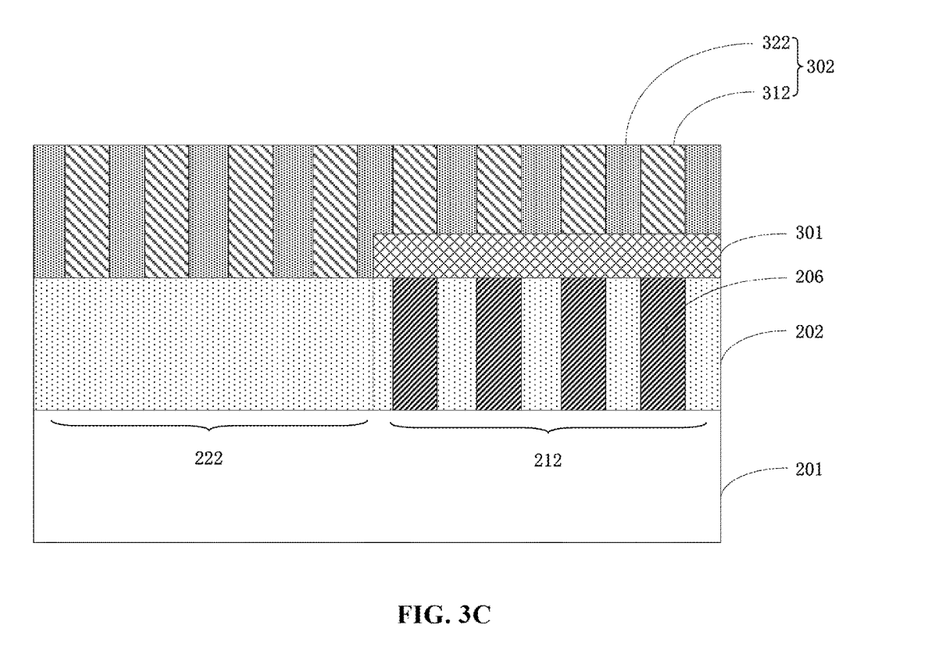

Referring to FIG. 3C, an annealing treatment is performed such that second copolymer 302 forms a staggered configuration of a third monomer 312 and a fourth monomer 322, as shown in FIG. 3C. In one embodiment, the annealing treatment is performed at a temperature in the range between 80° C. and 150° C., e.g., 90° C., 100° C., 120° C., 130° C., etc. In one embodiment, third monomer 312 and first monomer 214 have the same material and essential the same dimensions, and fourth monomer 322 and second monomer 224 have the same material and essential the same dimensions.

Figure 3D:
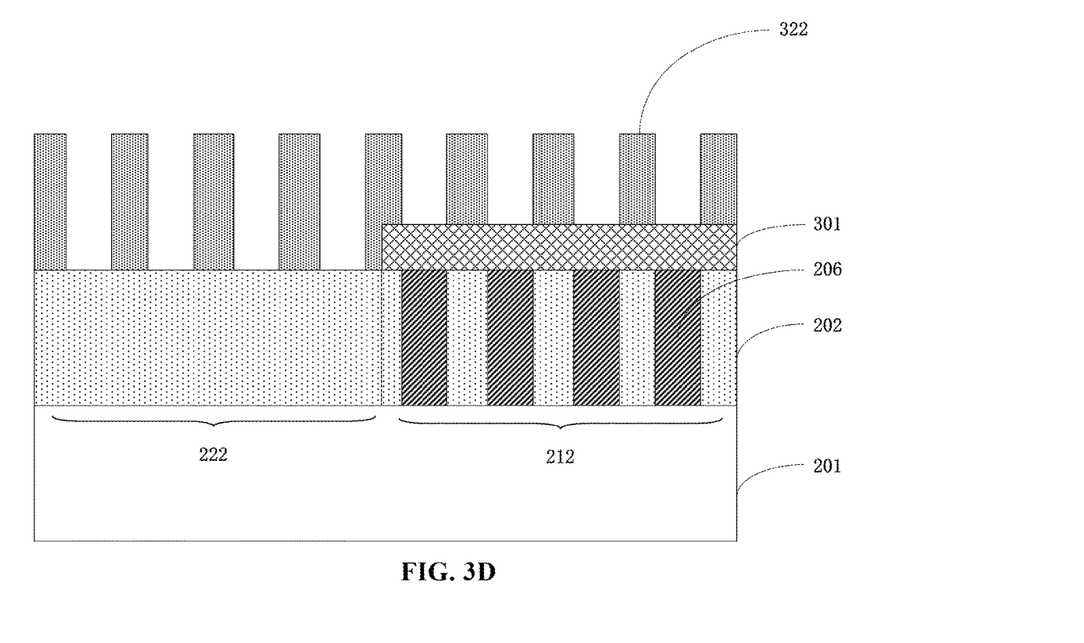

Referring to FIG. 3D, third monomer 312 is removed. In one example embodiment, third monomer 312 may be subjected to an UV curing treatment, third monomer 312 after the UV curing treatment may be washed with $CH_3COOH$ to be removed.

Figure 3E:
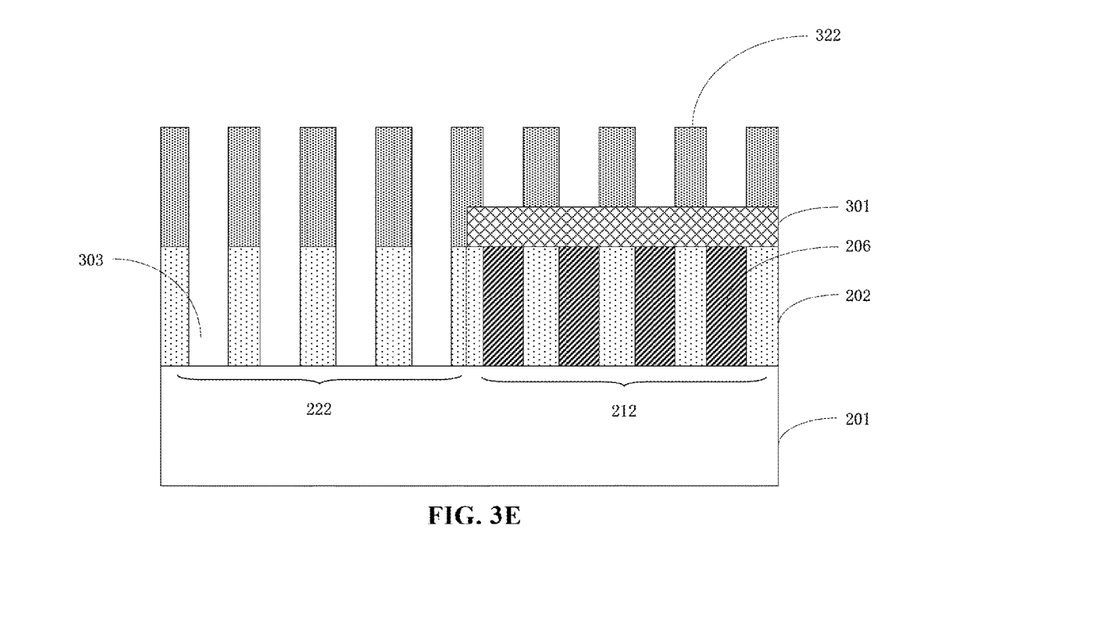

Referring to FIG. 3E, an etching process is performed on second portion 222 using fourth monomer 322 as a mask to form a second trench 303 extending to semiconductor substrate 201.

Figure 3F:
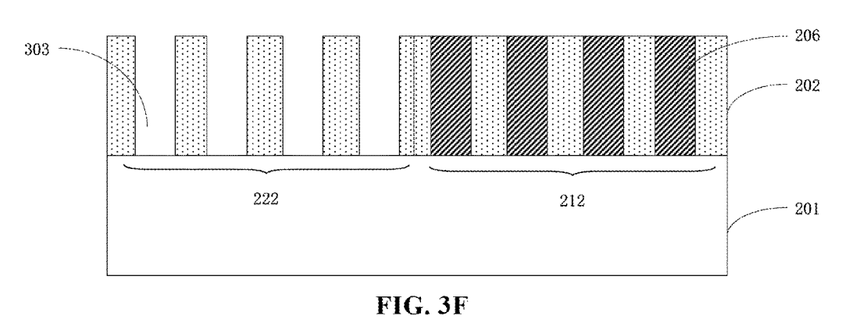

Referring to FIG. 3F, fourth monomer 322 and second hardmask 301 are removed. In one embodiment, fourth monomer 322 may be removed using a reactive ion etching (ME) process. In one embodiment, second hardmask 301 may be removed using a planarization process, such as a chemical mechanical polishing (CMP) process.

Figure 3G:
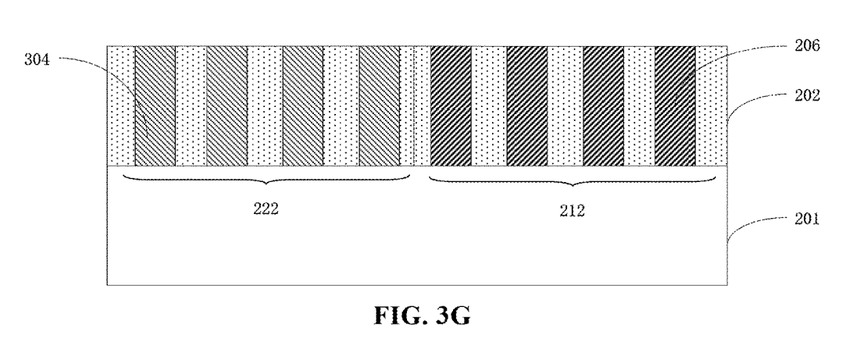

Referring to FIG. 3G, a second semiconductor fin 304 is epitaxially formed in second trench 303. In one embodiment, second semiconductor fin 304 include a SiGe fin. In one embodiment, the ratio of Ge/Si in a precursor is gradually adjusted during the process of epitaxially forming second semiconductor fin 304 from bottom to top, so that the content of Ge (Ge concentration, the proportion of germanium atoms) gradually changes from bottom to top.

In one example embodiment, the content of Ge (the proportion of germanium atoms) in second semiconductor fin 304 gradually increases from bottom to top. In another example embodiment, the content of Ge (the proportion of germanium atoms) in second semiconductor fin 304 gradually decreases from bottom to top.

In one example embodiment, the Ge content (the proportion of germanium atoms) in first semiconductor fin 206 gradually increases from bottom to top, and the Ge content in second semiconductor fin 304 gradually decreases from bottom to top. In another example embodiment, the Ge content in first semiconductor fin 206 gradually decreases from bottom to top, and Ge content in second semiconductor fin 304 gradually increases from bottom to top.

Figure 3H:
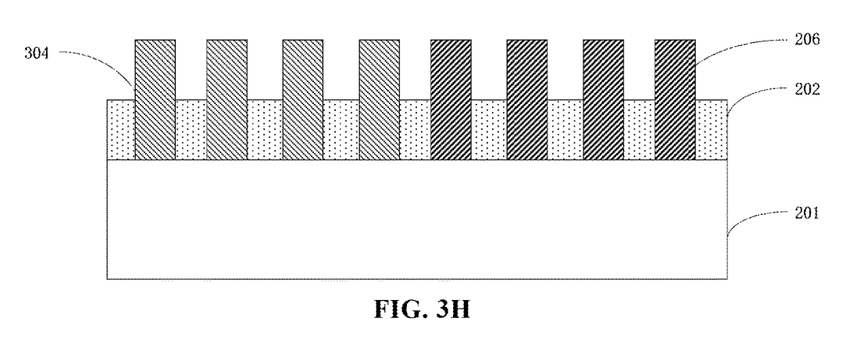

In one embodiment, referring to FIG. 3H, dielectric layer 202 may be etched back so that the upper surface of etched back dielectric layer 202 is lower than the upper surface of first semiconductor fin 206 and second semiconductor fin 304.

Thereafter, a gate structure may be formed on first semiconductor fin 206 and a gate structure may be formed on second semiconductor fin 304 to form different semiconductor devices.

Embodiments of the present invention also provide a semiconductor device. Referring to FIG. 3H, the semiconductor device may include a semiconductor substrate 201, and a first semiconductor fin 206 on semiconductor substrate 201. Semiconductor fin 206 has a germanium content that changes gradually from bottom to top. The semiconductor device may further include a dielectric layer 202 on semiconductor substrate 201 and side surfaces of first semiconductor fin 206, dielectric layer 202 having an upper surface lower than an upper surface of semiconductor fin 206.

Referring to FIG. 3H, the semiconductor device may further include a second semiconductor fin 304 on semiconductor substrate 201, second semiconductor fin 304 is a SiGe fin and has an upper surface higher than the upper surface of dielectric layer 202.

In one embodiment, the germanium content of first semiconductor fin 206 gradually increases from bottom to top, and the germanium content of second semiconductor fin 304 gradually decreases from bottom to top. In another embodiment, the germanium content of first semiconductor fin 206 gradually decreases from bottom to top, and the germanium content of second semiconductor fin 304 gradually increases from bottom to top.

Thus, embodiments of the present disclosure provide a detailed description of a semiconductor device and method of manufacturing the semiconductor device. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a semiconductor device, comprising:
    providing a semiconductor structure including a semiconductor substrate, a dielectric layer on the semiconductor substrate, and a hardmask on a second portion of the dielectric layer while exposing a first portion of the dielectric layer;
    forming a copolymer on the semiconductor structure;
    performing an annealing treatment such that the copolymer forms a staggered configuration of a first monomer and a second monomer;
    removing the first monomer;
    performing a first etching process on the first portion using the second monomer as a mask to form a first trench extending to the semiconductor substrate;
    removing the second monomer and the first hardmask; and
    epitaxially growing a first semiconductor fin in the first trench.

2. The method of claim 1, further comprising:
    forming a second trench in the second portion extending to the semiconductor substrate;
    epitaxially growing a second semiconductor fin in the second trench.

3. The method of claim 2, wherein the first semiconductor fin and the second semiconductor fin each comprise a SiGe fin.

4. The method of claim 3, wherein the first semiconductor fin and the second semiconductor fin each comprise a Ge content that gradually changes from bottom to top.

5. The method of claim 4, wherein the Ge content of the first semiconductor fin gradually increases from bottom to top, and the Ge content of the second semiconductor fin gradually decreases from bottom to top.

6. The method of claim 4, wherein the Ge content of the first semiconductor fin gradually decreases from bottom to top, and the Ge content of the second semiconductor fin gradually increases from bottom to top.

7. The method of claim 2, wherein forming the second trench in the second portion comprises:
    forming a second hardmask on the first portion of the dielectric layer;
    forming a second copolymer on the second hardmask and the second portion;
    performing a second annealing treatment such that the second copolymer forms a staggered configuration of a third monomer and a fourth monomer;
    removing the third monomer;
    performing a second etching process on the second portion using the fourth monomer as a mask to form the second trench extending to the semiconductor substrate;
    removing the forth monomer and the second hardmask.

8. The method of claim 7, wherein:
    the first copolymer and the second copolymer comprise a same material;
    the first monomer and the third monomer comprise a same material;
    the second monomer and the fourth monomer comprise a same material.

9. The method of claim 2, further comprising:
    etching back the dielectric layer such that an upper surface of the etched back dielectric layer is lower than an upper surface of the first semiconductor fin and the second semiconductor fin.

10. The method of claim 1, wherein the first copolymer comprises polystyrene-block-polymethylmethacrylate (PS-b-PMMA).

11. The method of claim 10, wherein the first monomer comprises polymethylmethacrylate and the second monomer comprises polystyrene.

12. The method of claim 11, wherein the first monomer has a cross-sectional width greater a cross-sectional width of the second monomer.

13. The method of claim 1, wherein forming the copolymer comprises a spin coating process.

14. The method of claim 1, wherein removing the first monomer comprises:
   performing an ultraviolet (UV) curing treatment on the first monomer;
   removing the first monomer by washing with $CH_3COOH$.

15. The method of claim 1, wherein removing the second monomer comprises a reactive ion etching process.

16. The method of claim 1, wherein the annealing treatment is performed at a temperature in a range between 80° C. and 150° C.

* * * * *